(12) United States Patent
Doyle et al.

(10) Patent No.: US 9,871,117 B2
(45) Date of Patent: Jan. 16, 2018

(54) VERTICAL TRANSISTOR DEVICES FOR EMBEDDED MEMORY AND LOGIC TECHNOLOGIES

(71) Applicant: Intel Corporation, Santa Clara, CA (US)

(72) Inventors: Brian S. Doyle, Portland, OR (US); Uday Shah, Portland, OR (US); Roza Kotlyar, Portland, OR (US); Charles C. Kuo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/062,007

(22) Filed: Mar. 4, 2016

(65) Prior Publication Data

US 2016/0190282 A1    Jun. 30, 2016

Related U.S. Application Data

(62) Division of application No. 14/039,696, filed on Sep. 27, 2013, now Pat. No. 9,306,063.

(51) Int. Cl.
*H01L 31/072* (2012.01)
*H01L 29/66* (2006.01)
(Continued)

(52) U.S. Cl.
CPC .. *H01L 29/66666* (2013.01); *H01L 21/02532* (2013.01); *H01L 21/30604* (2013.01);
(Continued)

(58) Field of Classification Search
CPC . H01L 33/62; H01L 51/0072; H01L 51/5012; H01L 51/56; C09K 11/06
(Continued)

(56) References Cited

U.S. PATENT DOCUMENTS 7,709,312 B2    5/2010  Jin et al.
7,728,324 B2 *  6/2010  Tezuka ............ H01L 21/823807
                                                        257/20
(Continued)

FOREIGN PATENT DOCUMENTS

JP    2008-311678    12/2008
KR    10-0537101     12/2010
(Continued)

OTHER PUBLICATIONS

Notification of Transmittal of the International Search Report and the Written Opinion of the International Searching Authority for PCT/US2014/053720 dated Dec. 22, 2014, 16 pages.
(Continued)

*Primary Examiner* — Andy Huynh
(74) *Attorney, Agent, or Firm* — Schwabe, Williamson & Wyatt P.C.

(57) ABSTRACT

Vertical transistor devices are described. For example, in one embodiment, a vertical transistor device includes an epitaxial source semiconductor region disposed on a substrate, an epitaxial channel semiconductor region disposed on the source semiconductor region, an epitaxial drain semiconductor region disposed on the channel semiconductor region, and a gate electrode region surrounding sidewalls of the semiconductor channel region. A composition of at least one of the semiconductor regions varies along a longitudinal axis that is perpendicular with respect to a surface of the substrate.

18 Claims, 13 Drawing Sheets

(51) Int. Cl.
- *H01L 29/78* (2006.01)
- *H01L 29/10* (2006.01)
- *H01L 29/165* (2006.01)
- *H01L 29/205* (2006.01)
- *H01L 29/739* (2006.01)
- *H01L 29/749* (2006.01)
- *H01L 21/02* (2006.01)
- *H01L 21/306* (2006.01)
- *H01L 29/49* (2006.01)
- *H01L 29/161* (2006.01)
- *H01L 29/201* (2006.01)
- *H01L 29/08* (2006.01)

(52) U.S. Cl.
CPC ...... *H01L 29/1037* (2013.01); *H01L 29/1054* (2013.01); *H01L 29/165* (2013.01); *H01L 29/205* (2013.01); *H01L 29/66356* (2013.01); *H01L 29/66363* (2013.01); *H01L 29/7391* (2013.01); *H01L 29/749* (2013.01); *H01L 29/7827* (2013.01); *H01L 29/7848* (2013.01); *H01L 29/0847* (2013.01); *H01L 29/161* (2013.01); *H01L 29/201* (2013.01); *H01L 29/4983* (2013.01)

(58) Field of Classification Search
USPC .......................................... 257/192
See application file for complete search history.

(56) References Cited

U.S. PATENT DOCUMENTS

| | | |
|---|---|---|
| 8,890,119 B2 | 11/2014 | Doyle et al. |
| 2006/0082884 A1 | 4/2006 | Feng et al. |
| 2009/0008631 A1 | 1/2009 | Hurkx et al. |
| 2010/0330759 A1 | 12/2010 | Forbes |
| 2011/0147842 A1 | 6/2011 | Cappellani et al. |
| 2011/0233512 A1 | 9/2011 | Yang et al. |
| 2013/0093000 A1 | 4/2013 | Guo et al. |
| 2014/0092677 A1 | 4/2014 | Karpov et al. |
| 2014/0166981 A1 | 6/2014 | Doyle et al. |
| 2014/0175575 A1 | 6/2014 | Doyle et al. |
| 2014/0175583 A1 | 6/2014 | Doyle et al. |

FOREIGN PATENT DOCUMENTS

| | | |
|---|---|---|
| TW | 201110348 | 3/2001 |
| TW | 200625464 | 7/2006 |
| TW | 201330268 | 7/2013 |

OTHER PUBLICATIONS

International Preliminary Report on Patentability for PCT/US2014/053720 dated Mar. 29, 2016, 11 pages.

\* cited by examiner

VERTICAL TRANSISTOR DEVICES FOR EMBEDDED MEMORY AND LOGIC TECHNOLOGIES

RELATED APPLICATIONS

This application is a divisional of U.S. application Ser. No. 14/039,696, filed on Sep. 27, 2013, the entire contents of which are hereby incorporated by reference.

TECHNICAL FIELD

Embodiments of the invention are in the field of semiconductor devices and, in particular, vertical transistor devices for embedded memory and logic technologies.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

Classical transistor scaling makes designing a transistor with higher drive current and/or lower leakage current increasingly difficult. Planar transistors suffer from the disadvantage of being difficult to build an asymmetric transistor in which engineering the source can be independent from engineering at the channel and drain ends of the transistor.

BRIEF DESCRIPTION OF THE DRAWINGS

Generally.

Generally.

Generally.

Generally.

Generally.

Generally.

DESCRIPTION OF THE EMBODIMENTS

Designs for vertical field effect transistors are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

In one embodiment, a vertical transistor device includes a channel, a source region, and a drain region that can be controlled independently. Changes are introduced in a channel of a vertical transistor device in a controlled manner in such a way that a source end of the channel can differ significantly in composition from the channel and a drain end of the channel. This vertical transistor device increases a drive current while not increasing the off-state leakage current, or decreases an off state leakage current while not significantly decreasing the drive current of the device. The vertical transistor device can include an enhanced injection velocity layer at the source end, a channel that is strained through use of different materials for the channel in comparison to source and drain regions, or a channel that is strained monotonically between source and drain ends by use of a single channel material or material with a composition that varies along the channel from the source end to the drain end. The vertical transistor device may include a channel that includes both of a source injection region and one or more channel change as discussed above. These changes can be implemented in group IV materials (e.g., Si, Ge, SiGe, etc.) or III-V materials or a combination of group IV and III-V materials. The vertical transistor device may also change a work function of a gate when moving from a source end of the channel to a drain end of the channel.

Generally, embodiments described herein may be suitable for high performance or scaled transistors for embedded memory and logic devices having low power applications.

Figure 1:
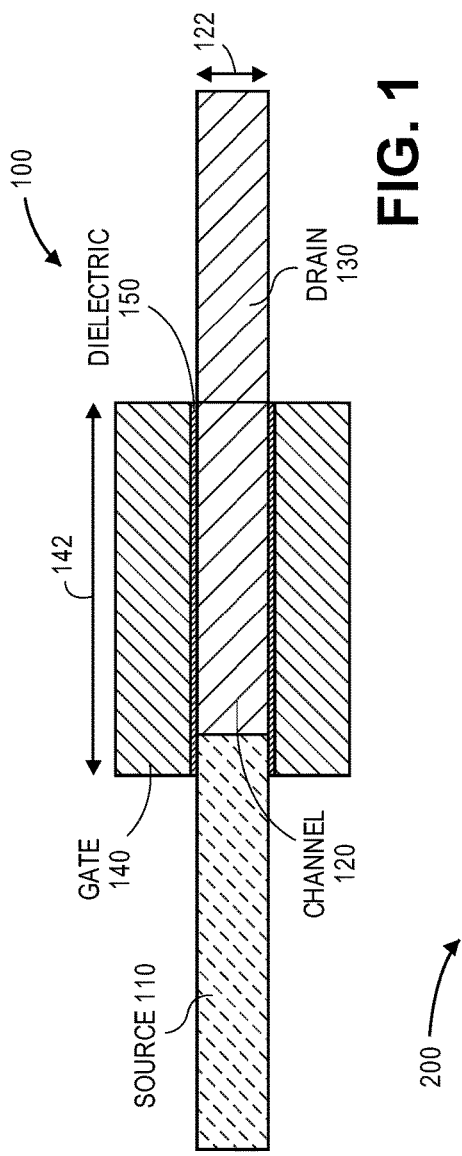
FIG. 1 illustrates a vertical transistor device having an effective mass that is varied from a source end of a channel to a drain end of the channel in accordance with one embodiment of the present invention.

FIG. 1 illustrates a vertical transistor device having an effective mass that is varied from a source end of a channel to a drain end of the channel in accordance with one embodiment of the present invention. The vertical transistor device 100 includes a source region 100, a channel 120, a drain region 130, a gate region 140, and a dielectric region 150. In one embodiment, the source region 100 has an effective mass material Meff2 and the channel and drain regions have a different effective mass material Meff1. Meff2 have a higher effective mass than Meff1 (e.g., Meff2 may be approximately equal to 2*Meff1). A higher effective mass means a higher density of states which results in more electron injection into the channel and more drain current. The gate length may be fixed at 15 nanometers (nm) while the body thickness 122 is approximately 5 nm.

Figure 2:
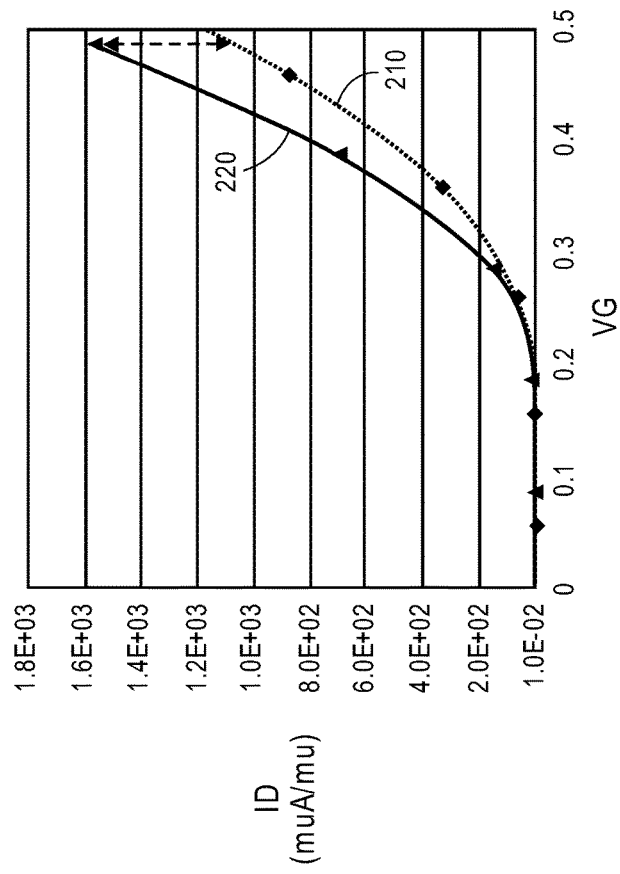
FIG. 2 illustrates a simulation of the vertical transistor device 100 having an effective mass that is varied from a source end of a channel to a drain end of the channel in accordance with one embodiment of the present invention.

FIG. 2 illustrates a simulation of the vertical transistor device 100 having an effective mass that is varied from a source end of a channel to a drain end of the channel in accordance with one embodiment of the present invention. The simulation may be performed with Non-Equilibrium Green's Function (NEGF) quantum transport of the device 100. The curve 210 represents the characteristics of a control transistor having Meff1 throughout the source, channel, and drain regions. The curve 220 represents a transistor 100 in which a source region has a higher effective mass (e.g., Meff2) while the channel and drain regions have a lower effective mass (e.g., Meff1). The curve 220 for a transistor with different effective masses has a drive current (ID) that is approximately 50% greater than a drive current of the control transistor at Vg equal to 0.5 volts. The curve 220 has approximately the same or the same off state leakage current in comparison to curve 210.

Figure 3:
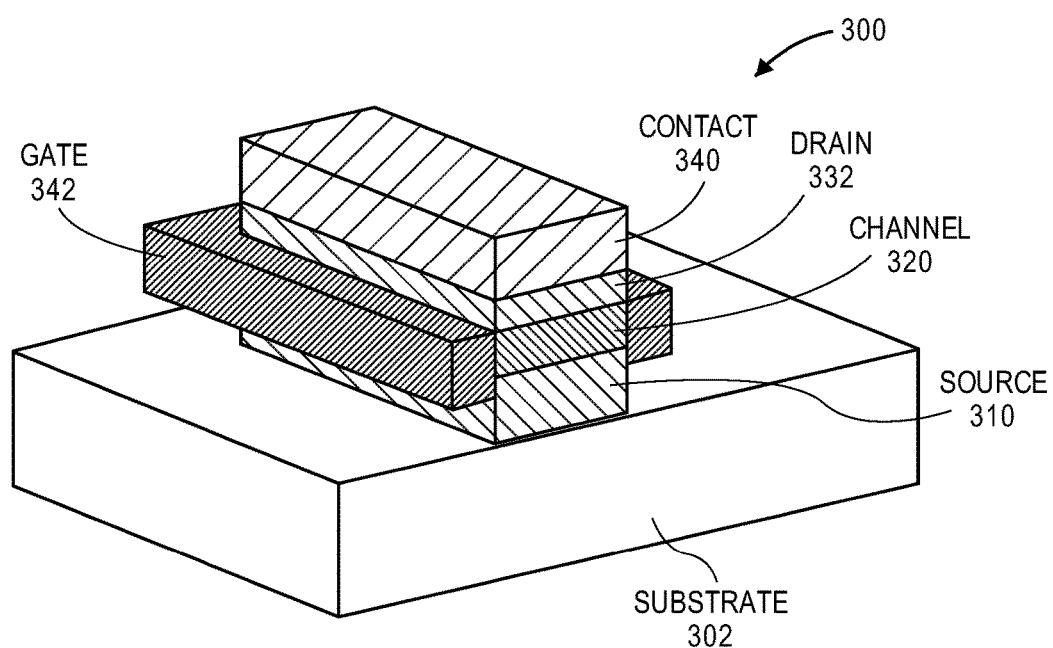
FIG. 3 illustrates a conventional vertical transistor device.

FIG. 3 illustrates a conventional vertical transistor device. The device 300 includes a substrate 302 (bottom contact), a n+ source region 310, a p-type channel region 320, a n+ drain region 332, a top contact 340, and a gate region 341. This device 300 can be fabricated by first doping the n+ drain region with an ion implantation, etching a vertical pillar, doping the n+ source region 310 and substrate with another ion implantation, and the forming the gate region 342. The channel region is nearly identical at source and drain ends of the channel. The implanted ions may have a distribution (e.g., Gaussian) in the implanted layer and may have defects caused by the implant. An anneal such as a high temperature 1000 C dopant activation rapid thermal anneal will be needed to repair some of the implant damage and to activate dopants. The resulting distribution of implanted ions is typically broad.

Figure 4A:
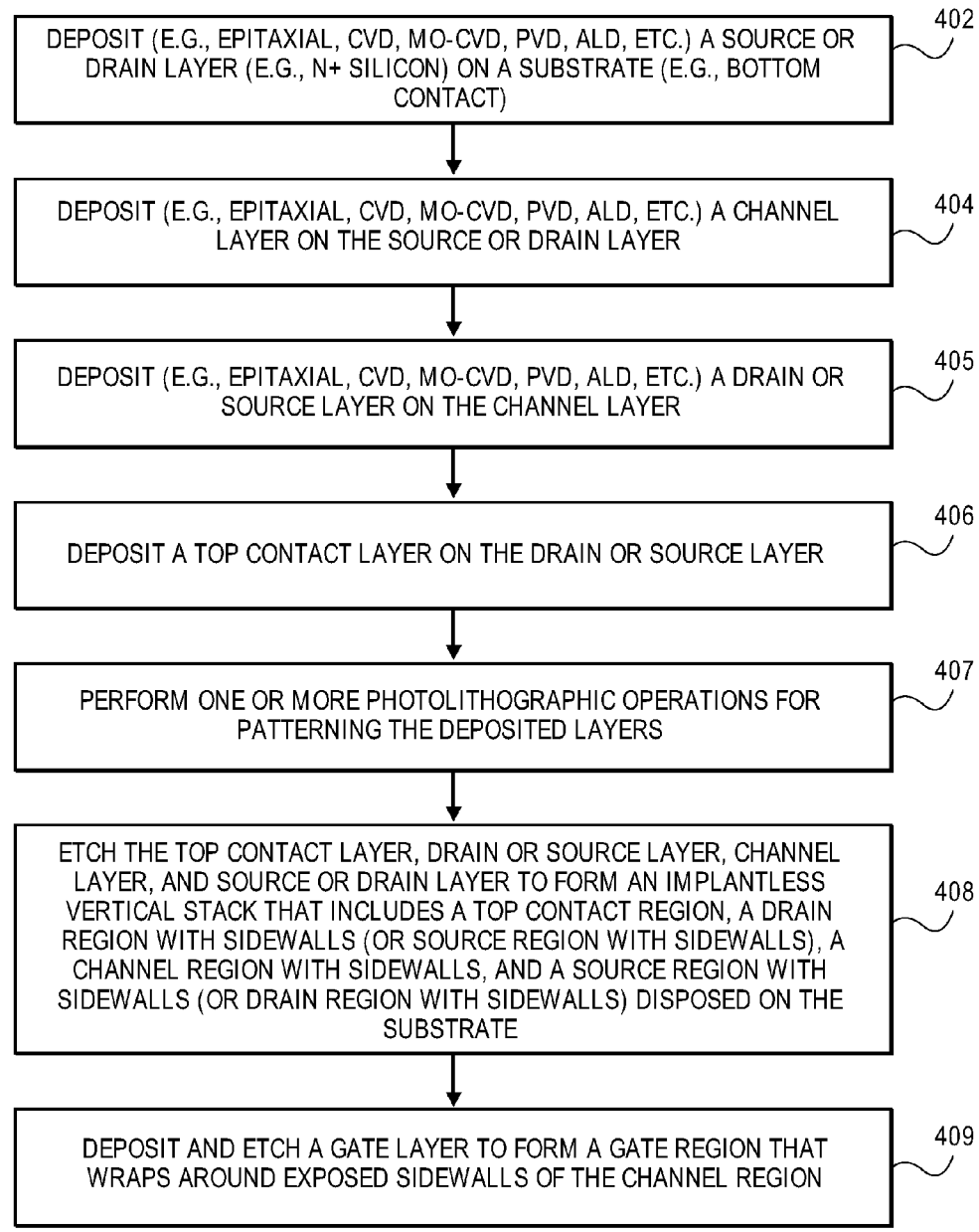
FIG. 4A illustrates a method of forming a vertical transistor device in accordance with one embodiment of the present invention.
Figure 4B:
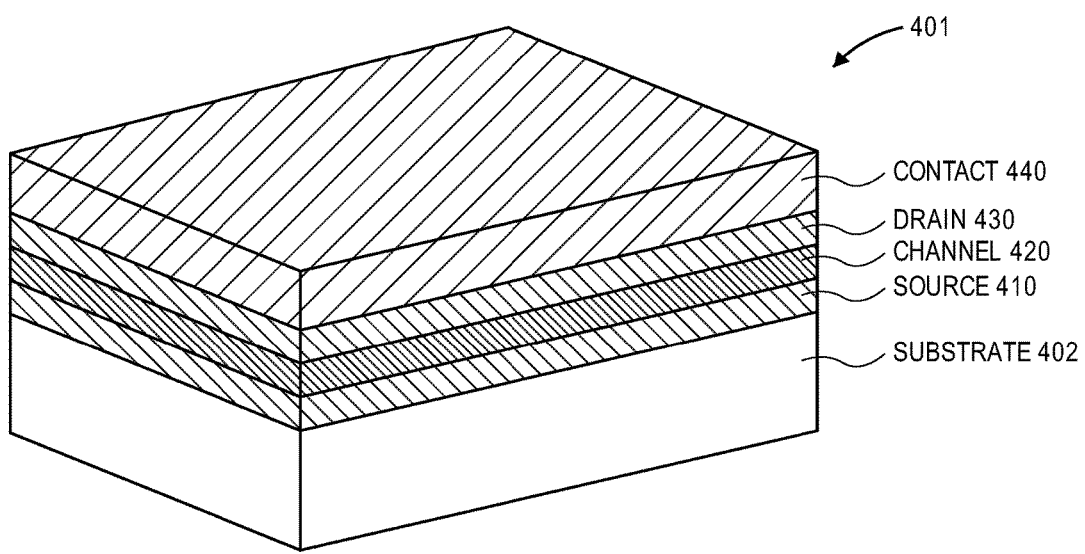
FIG. 4B illustrates a vertical stack 401 of transistor layers in accordance with one embodiment of the present invention.
Figure 4C:
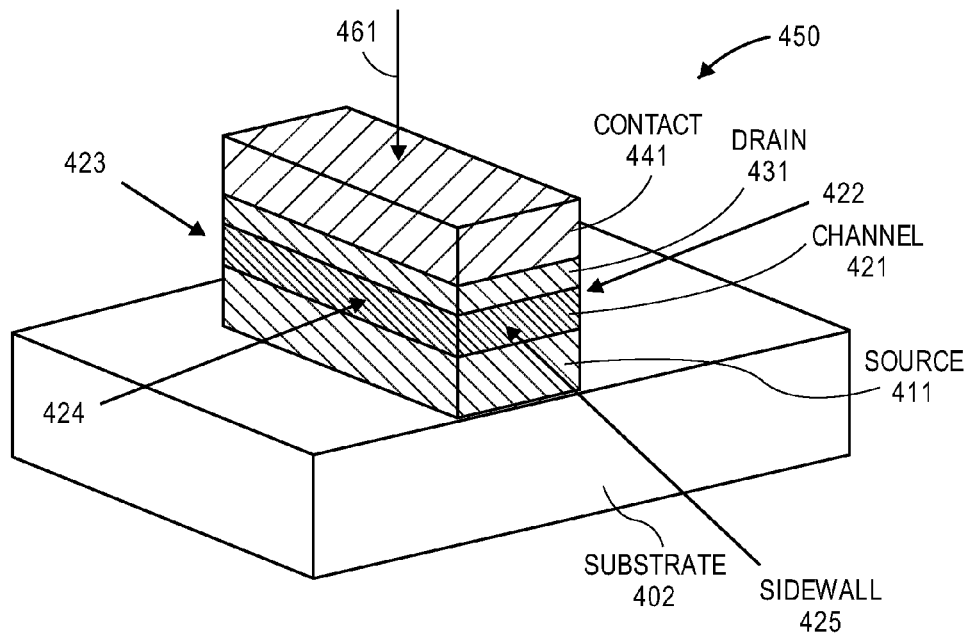
FIG. 4C illustrates a vertical transistor device 450 in accordance with one embodiment of the present invention.

FIG. 4a illustrates a method of forming a vertical transistor device in accordance with one embodiment of the present invention. At block 403, the method 400 includes depositing (e.g., epitaxial, CVD, MO-CVD, PVD, ALD, etc.) a source or drain layer (e.g., n+ Silicon) on a substrate (e.g., bottom contact). At block 404, a channel layer (e.g., p-type) is deposited (e.g., epitaxial, CVD, MO-CVD, PVD, ALD, etc.) on the source or drain layer. At block 405, a drain or source layer (e.g., n+ Silicon) is deposited (e.g., epitaxial, CVD, MO-CVD, PVD, ALD, etc.) on the channel layer. At block 406, a top contact is deposited on the drain or source layer. At block 407, one or more photolithographic operations are performed for patterning the deposited layers. One or more photoresist or hard masking layers (e.g., nitride, oxide) may be used for patterning the deposited layers. At block 408, the top contact, drain or source layer, channel layer, and source or drain layer are etched to form an implantless vertical stack that includes a top contact region, a drain region with sidewalls (or source region with sidewalls), a channel region with sidewalls, and a source region with sidewalls (or drain region with sidewalls) disposed on the substrate. At block 409, a gate layer is deposited and etched to form a gate region that wraps around exposed sidewalls of the channel region. This method 400 provides for control of the fabrication of the transistor itself with practically monolayer control as the stack is being built from the substrate to the source to the channel to the drain (or from the substrate to the drain to the channel to the source). The vertical transistor device has a longitudinal axis perpendicularly oriented to a surface plane of a crystalline substrate 402 as illustrated in FIGS. 4B and 4C. The depositing of the channel layer may include modifying growth conditions to vary a semiconductor composition across a thickness of the channel semiconductor layer.

FIG. 4B illustrates a vertical stack 401 of transistor layers in accordance with one embodiment of the present invention. A source layer 410 (e.g., n+ Silicon) is deposited (e.g., epitaxial, CVD, MO-CVD, PVD, ALD, etc.) on a substrate 402 (e.g., bottom contact). A channel layer 420 (e.g., p-type) is deposited (e.g., epitaxial, CVD, MO-CVD, PVD, ALD, etc.) on the source layer 410. A drain layer 430 (e.g., n+ Silicon) is deposited (e.g., epitaxial, CVD, MO-CVD, PVD, ALD, etc.) on the channel layer 420. A top contact 440 is deposited on the drain layer 430. In another embodiment, the drain and source layers are switched (i.e., the drain layer 430 is deposited on the substrate, the channel layer 420 is deposited on the drain layer 430, the source layer 410 is deposited on the channel layer 420, and the top contact 440 is deposited on the source layer 410).

FIG. 4C illustrates a vertical transistor device 450 in accordance with one embodiment of the present invention. After one or more photolithographic operations, the top contact, drain layer, channel layer, and source layer of the vertical stack 400 of FIG. 4B are etched to form an implantless vertical stack that includes a top contact region 441, a drain region 431, a channel region 421 with sidewalls 422-425, and a source region 411 disposed on the substrate 402. The vertical transistor device 450 has a longitudinal axis 461 perpendicularly oriented to a surface plane of the crystalline substrate 402. In another embodiment, the drain and source layers are switched (i.e., an implantless vertical stack includes a top contact region 441, a source region 411, a channel region 421 with sidewalls 422-425, and a drain region 431 disposed on the substrate 402) and thicknesses of these layers adjusted if appropriate for a particular design.

Figure 4D:
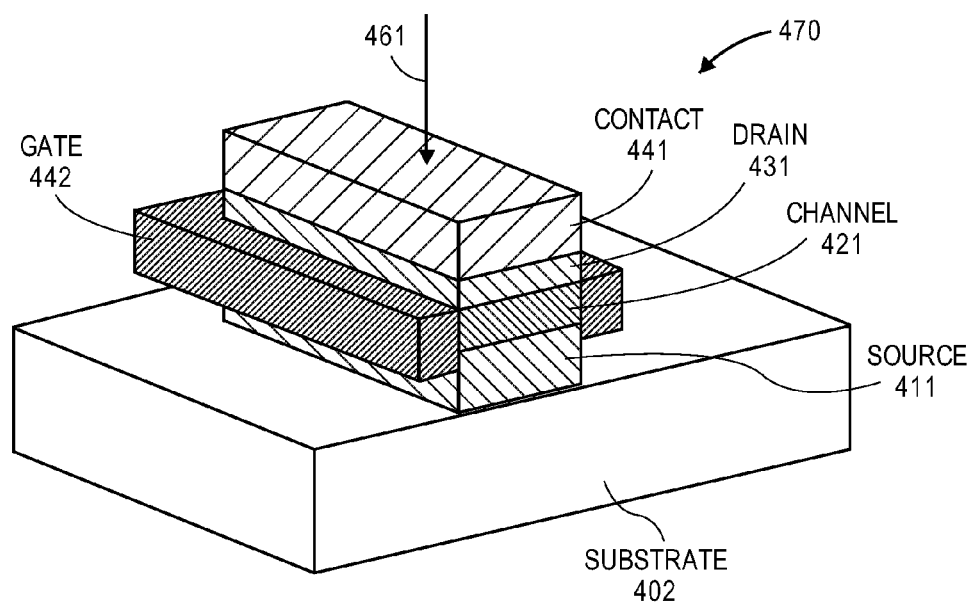
FIG. 4D illustrates a vertical transistor device 470 in accordance with one embodiment of the present invention.

FIG. 4D illustrates a vertical transistor device 470 in accordance with one embodiment of the present invention. A gate layer is deposited and etched to form a gate region 442 that wraps around the channel region 421 with sidewalls 422-425. In one embodiment, the source, channel, and drain layers are epitaxially deposited in-situ. The layers are activated upon deposition and have sharp interface junctions in contrast to ion implanted regions of conventional vertical transistors that need a high temperature anneal and do not have sharp interface junctions between the implanted dopants. The vertical transistor device 470 has a longitudinal axis 461 perpendicularly oriented to a surface plane of the crystalline substrate 402. In another embodiment, the drain and source layers are switched (i.e., the drain layer 431 is deposited on the substrate, the channel layer 420 is deposited on the drain layer 431, the source layer 411 is deposited on the channel layer 421, and the top contact 441 is deposited on the source layer 411) and thicknesses of these layers adjusted if appropriate for a particular design.

Figure 5A:
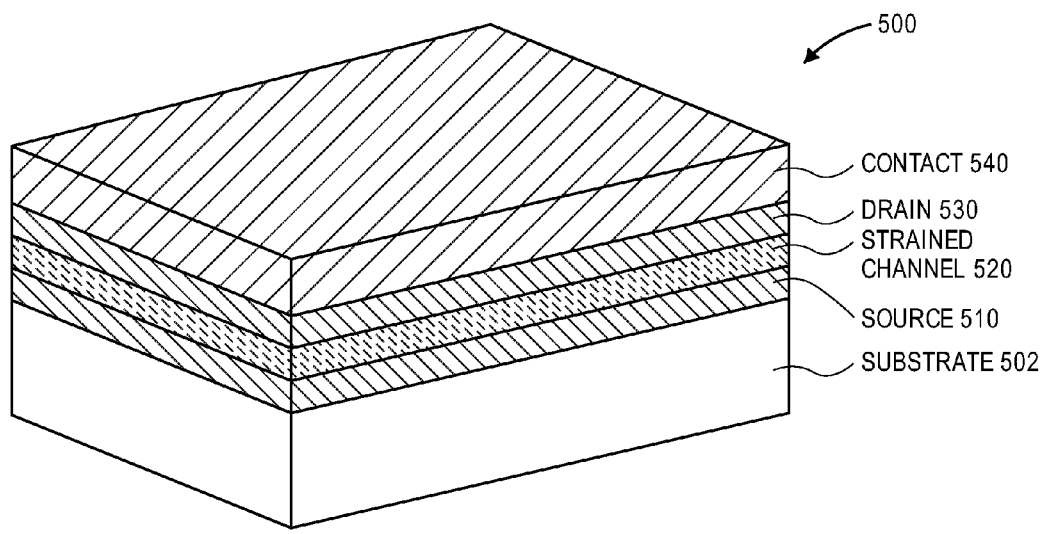
FIG. 5A illustrates a vertical stack 500 of transistor layers in accordance with one embodiment of the present invention.

FIG. 5A illustrates a vertical stack 500 of transistor layers in accordance with one embodiment of the present invention. A source layer 510 (e.g., n+ Silicon) is deposited (e.g., epitaxial, CVD, MO-CVD, PVD, ALD, etc.) on a substrate 502 (e.g., bottom contact). A strained channel layer 520 (e.g., p-type) is deposited (e.g., epitaxial, CVD, MO-CVD, PVD, ALD, etc.) on the source layer 510. A drain layer 530 (e.g., n+ Silicon) is deposited (e.g., epitaxial, CVD, MO-CVD, PVD, ALD, etc.) on the channel layer 520. A top contact 540 is deposited on the drain layer 530. In another embodiment, the drain and source layers are switched (i.e., the drain layer 530 is deposited on the substrate, the channel layer 520 is deposited on the drain layer 530, the source layer 510 is deposited on the channel layer 520, and the top contact 540 is deposited on the source layer 510) and thicknesses of these layers adjusted if appropriate for a particular design.

Figure 5B:
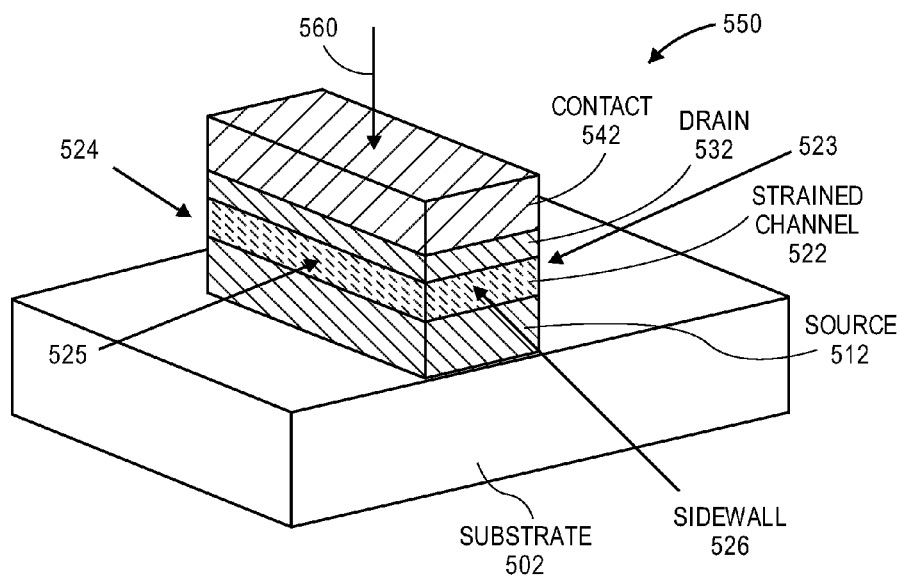
FIG. 5B illustrates a vertical transistor device 550 in accordance with one embodiment of the present invention.

FIG. 5B illustrates a vertical transistor device 550 in accordance with one embodiment of the present invention. The top contact, drain layer, strained channel layer, and source layer of the vertical stack 500 of FIG. 5A are etched to form an implantless vertical stack that includes a top contact region 542, a drain region 532, a strained channel region 522, and a source region 512 disposed on the substrate 502. The strained channel region 522 includes sidewalls 523-526. The vertical transistor device 550 has a longitudinal axis 560 perpendicularly oriented to a surface plane of the crystalline substrate 502. In another embodiment, the drain and source layers are switched (i.e., an implantless vertical stack includes a top contact region 542, a source region 512, a strained channel region 522, and a drain region 532 disposed on the substrate 502) and thicknesses of these layers adjusted if appropriate for a particular design.

Figure 5C:
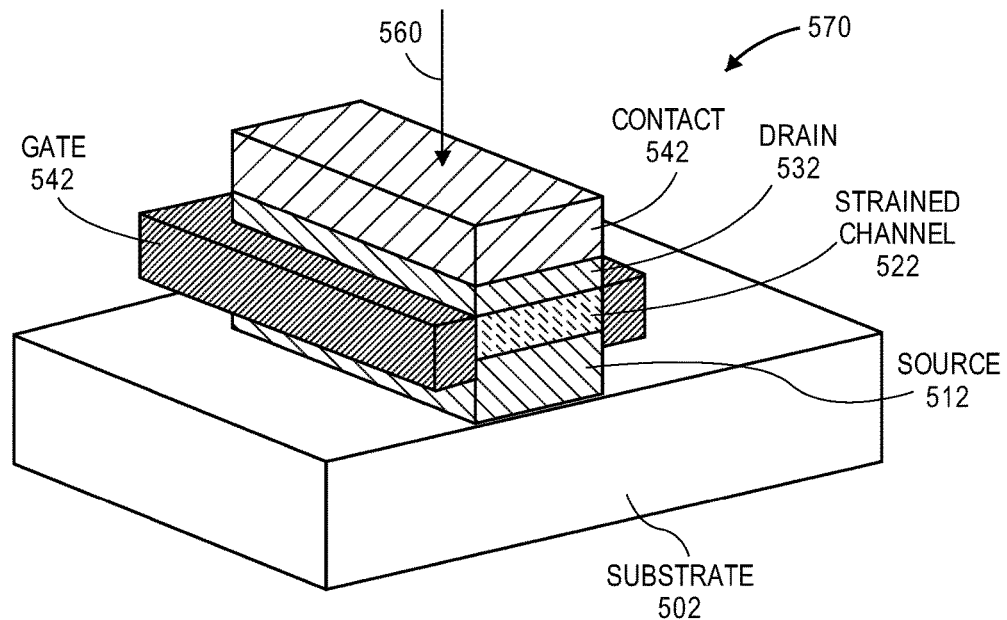
FIG. 5C illustrates a vertical transistor device 570 in accordance with one embodiment of the present invention.

FIG. 5C illustrates a vertical transistor device 570 in accordance with one embodiment of the present invention. A gate layer is deposited and etched to form a gate region 542 that wraps around the strained channel region with sidewalls 523-526. In one embodiment, after the source is deposited, the channel is selectively deposited, either with a material of similar composition such as Si drain/source with SiGe channel for Group IV materials. In another embodiment, InAs source/drain regions are formed with an InGaAs channel. The lattice constant of the epitaxially deposited materials (e.g., strained channel) can be adjusted to strain the lattice, which results in higher electron/hole mobility. The vertical transistor device 570 has a longitudinal axis 560 perpendicularly oriented to a surface plane of the crystalline substrate 502. In another embodiment, the drain and source layers are switched (i.e., the drain layer 532 is deposited on the substrate, the channel layer 522 is deposited on the drain layer 532, the source layer 512 is deposited on the channel layer 522, and the top contact 542 is deposited on the source layer 512) and thicknesses of these layers adjusted if appropriate for a particular design.

Figure 6:
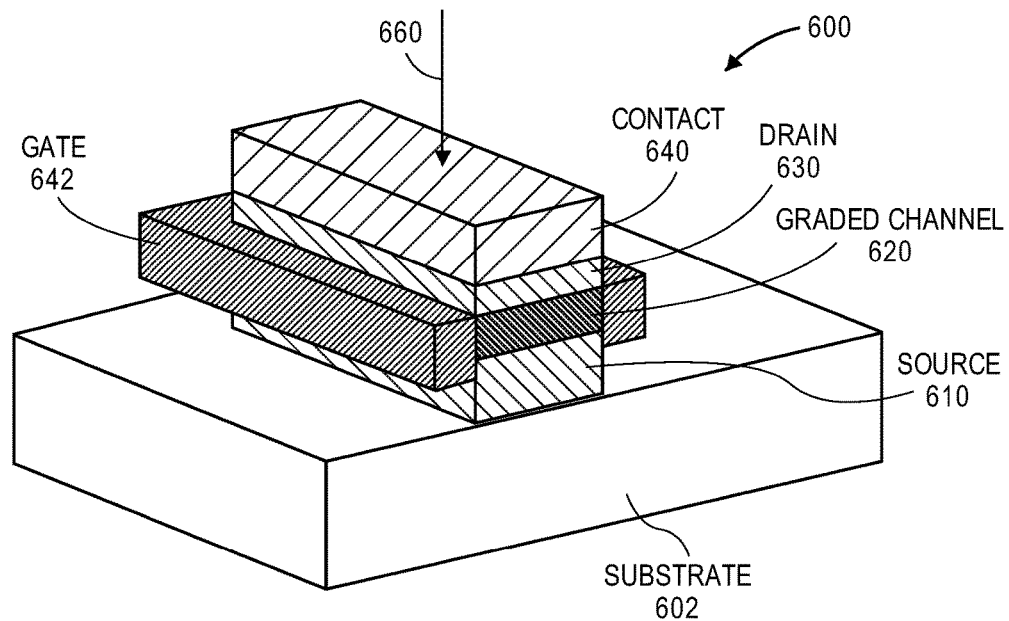
FIG. 6 illustrates a vertical transistor device 600 in accordance with one embodiment of the present invention.

Generally, FIG. 6 illustrates a vertical transistor device 600 in accordance with one embodiment of the present invention. A top contact (e.g., p-type contact), drain layer (e.g., n+ drain), graded channel layer, and source layer (e.g., p+ source) of a vertical stack are etched to form an implantless vertical stack that is disposed on a substrate 602 (e.g., bottom contact). The vertical device 600 includes a top contact region 640, a drain region 630, a graded channel region 620, and a source region 610 disposed on the substrate 602. A gate layer is deposited and etched to form a gate region 642 that wraps around sidewalls (e.g., 4 sidewalls) of the graded channel region. In one embodiment, after the source is deposited, the graded channel is selectively deposited, either with a material of similar composition such as Si source with SiGe channel and drain for Group IV materials. In another embodiment, III-V materials are used such as an InAs source region that is formed with a graded InGaAs channel and drain region. The vertical transistor device 600 has a longitudinal axis 660 perpendicularly oriented to a surface plane of the crystalline substrate 602. In another embodiment, the drain and source layers are switched and thicknesses of these layers adjusted if appropriate for a particular design.

Figure 7:
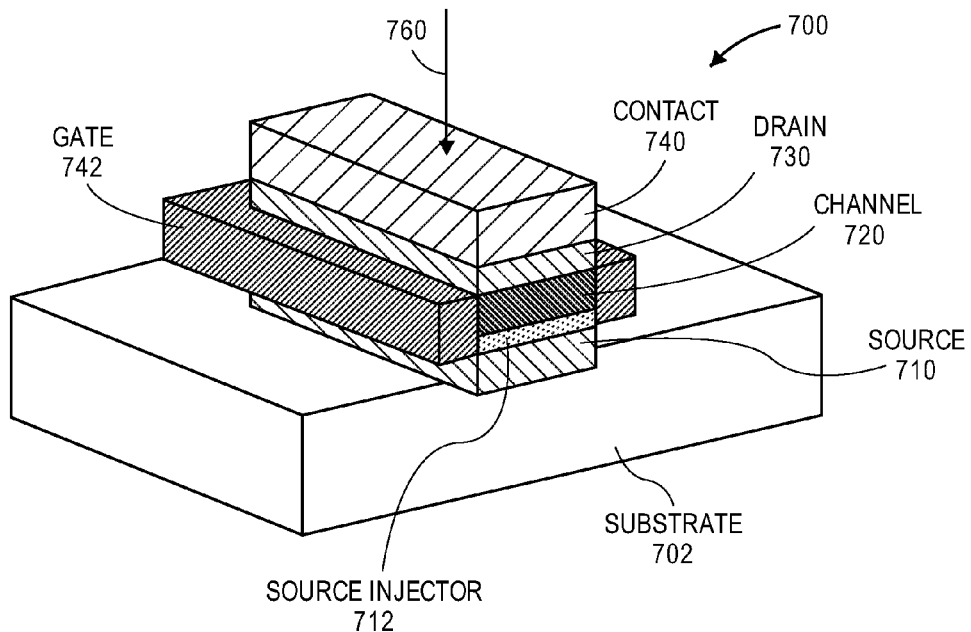
FIG. 7 illustrates a vertical transistor device 700 in accordance with one embodiment of the present invention.

Generally, FIG. 7 illustrates a vertical transistor device 700 in accordance with one embodiment of the present invention. A top contact (e.g., p-type contact), drain layer (e.g., n+ drain), graded channel layer, and source layer (e.g., p+ source) of a vertical stack are etched to form an implantless vertical stack that is disposed on a substrate 702 (e.g., bottom contact). The vertical device 600 includes a top contact region 740, a drain region 730, a channel region 720, a source injector region 712, and a source region 710 disposed on the substrate 702. A gate layer is deposited and etched to form a gate region 742 that wraps around sidewalls (e.g., 4 sidewalls) of the channel region and sidewalls of the source injector region. In one embodiment, after the source is deposited, the source injector region is deposited, either with Ge injector region at the source end of a Si or SiGe transistor. In another embodiment, III-V materials are used such as an InAs injector source region at source end of a InGaAs III-V transistor. The vertical transistor device 700 has a longitudinal axis 760 perpendicularly oriented to a surface plane of the crystalline substrate 702. In another embodiment, the drain and source layers are switched and thicknesses of these layers adjusted if appropriate for a particular design.

Figure 8:
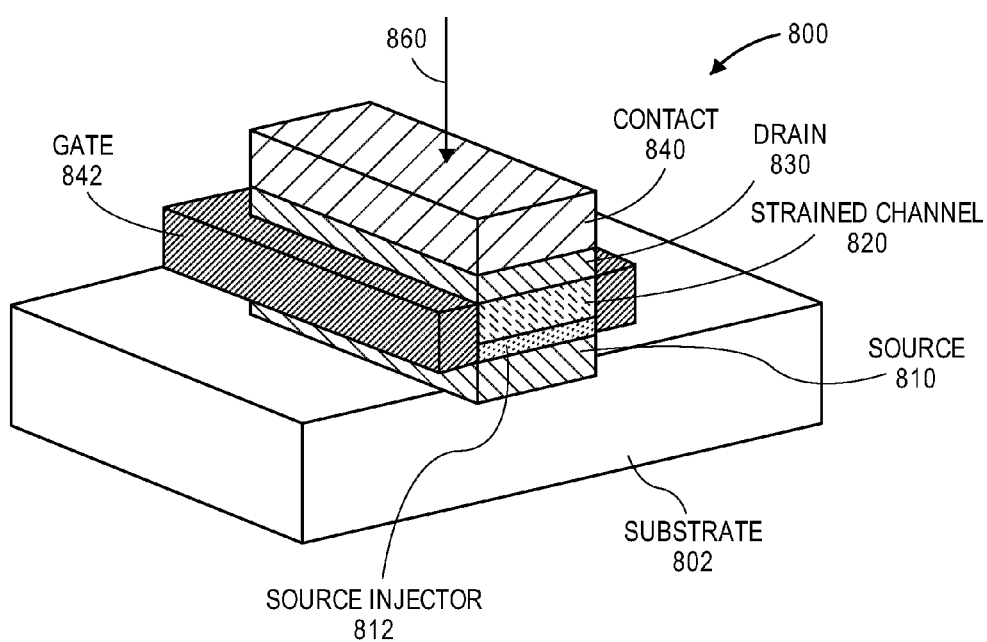
FIG. 8 illustrates a vertical transistor device 800 in accordance with one embodiment of the present invention.

Generally, FIG. 8 illustrates a vertical transistor device 800 in accordance with one embodiment of the present invention. A top contact (e.g., p-type contact), drain layer (e.g., n+ drain), strained channel layer, a source injector layer, and a source layer (e.g., p+ source) of a vertical stack are etched to form an implantless vertical stack that is disposed on a substrate 802 (e.g., bottom contact). The vertical device 800 includes a top contact region 840, a drain region 830, a strained channel region 820, a source injector region 812, and a source region 810 disposed on the substrate 802. A gate layer is deposited and etched to form a gate region 842 that wraps around sidewalls (e.g., 4 sidewalls) of the channel region and sidewalls of the source injector region. In one embodiment, after the source is deposited, the source injector region is deposited, either with Ge injector region at the source end of a Si or SiGe transistor. In another embodiment, III-V materials are used such as an InAs injector source region at source end of a InGaAs III-V transistor. The vertical transistor device 800 has a longitudinal axis 860 perpendicularly oriented to a surface plane of the crystalline substrate 802. In another embodiment, the drain and source layers are switched and thicknesses of these layers adjusted if appropriate for a particular design.

Figure 9:
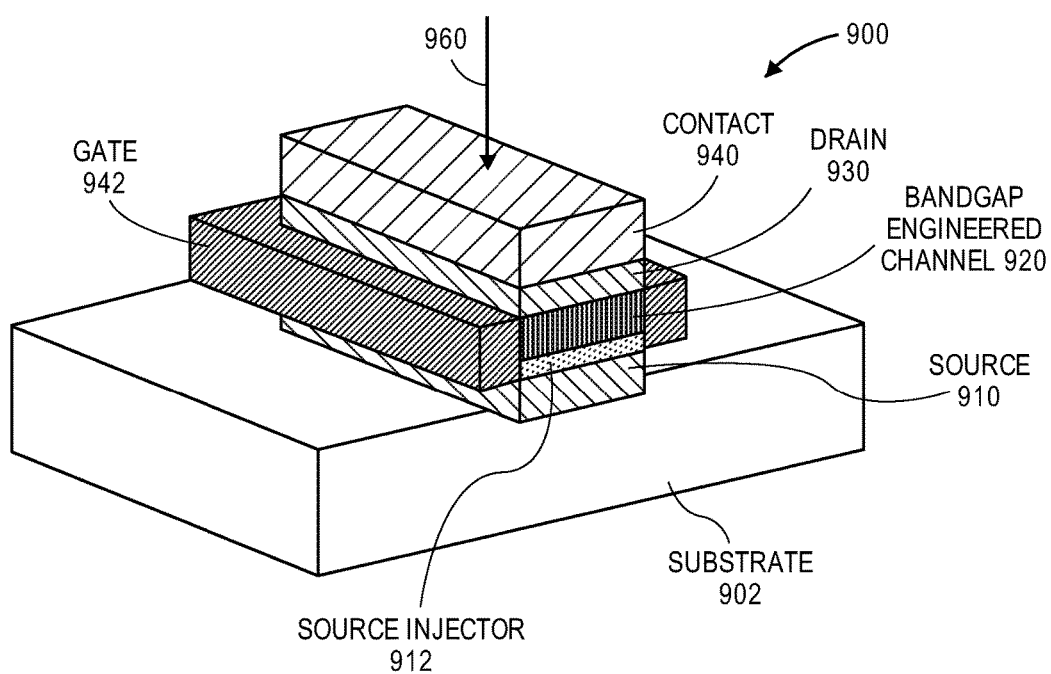
FIG. 9 illustrates a vertical transistor device 900 in accordance with one embodiment of the present invention.

Generally, FIG. 9 illustrates a vertical transistor device 900 in accordance with one embodiment of the present invention. A top contact (e.g., p-type contact), drain layer (e.g., n+ drain), strained/graded channel layer, a source injector layer, and a source layer (e.g., p+ source) of a vertical stack are etched to form an implantless vertical stack that is disposed on a substrate 902 (e.g., bottom contact). The vertical device 900 includes a top contact region 940, a drain region 930, a strained/graded (bandgap engineered) channel region 920, a source injector region 912, and a source region 910 disposed on the substrate 902. A gate layer is deposited and etched to form a gate region 942 that wraps around sidewalls (e.g., 4 sidewalls) of the channel region and sidewalls of the source injector region. In one embodiment, after the source is deposited, the source injector region is deposited, either with Ge injector region at the source end of a Si or SiGe transistor. In another embodiment, III-V materials are used such as an InAs injector source region at source end of a InGaAs III-V transistor. The vertical transistor device 900 has a longitudinal axis 960 perpendicularly oriented to a surface plane of the crystalline substrate 902. In another embodiment, the drain and source layers are switched and thicknesses of these layers adjusted if appropriate for a particular design.

Figure 10A:
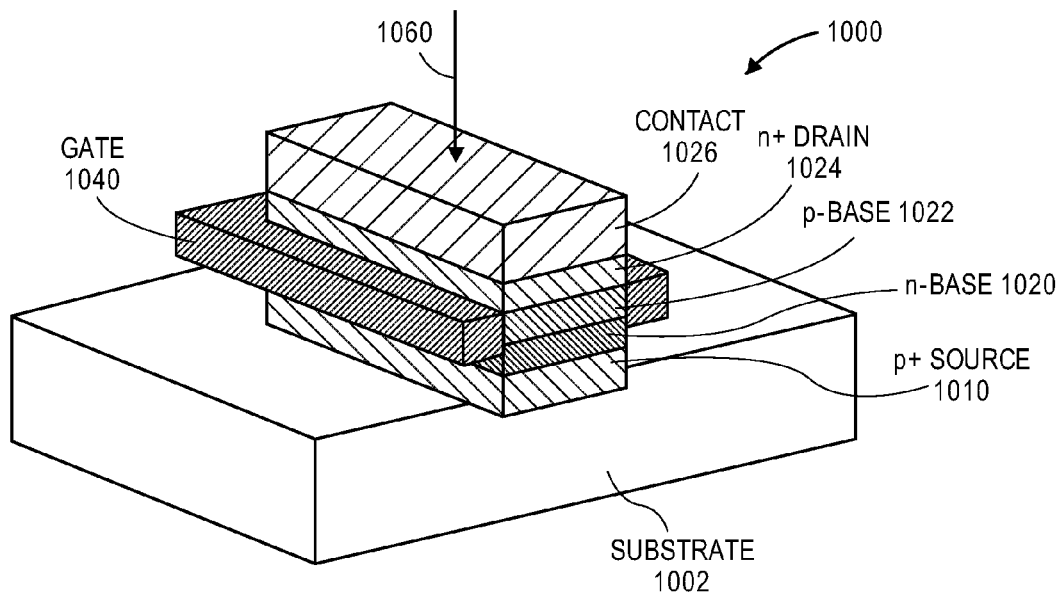
FIG. 10A illustrates a vertical transistor device 1000 with a thyristor-like architecture in accordance with one embodiment of the present invention.

Generally, FIG. 10A illustrates a vertical transistor device 1000 with a thyristor-like architecture in accordance with one embodiment of the present invention. A top contact (e.g., p-type contact), drain layer (e.g., n+ drain), a base layer (e.g., p-type), a base layer (e.g., n-type), and a source layer (e.g., p+ source) of a vertical stack are etched to form an implantless vertical stack that is disposed on a substrate 1002 (e.g., bottom contact). The vertical device 1000 includes a top contact region 1026, a drain region 1024, base regions 1022 and 1020, and a source region 1010 disposed on the substrate 1002. A gate layer is deposited and etched to form a gate region 1040 that wraps around sidewalls (e.g., 4 sidewalls) of the base region 1022. The vertical transistor device 1000 has a longitudinal axis 1060 perpendicularly oriented to a surface plane of the crystalline substrate 1002.

Figure 10B:
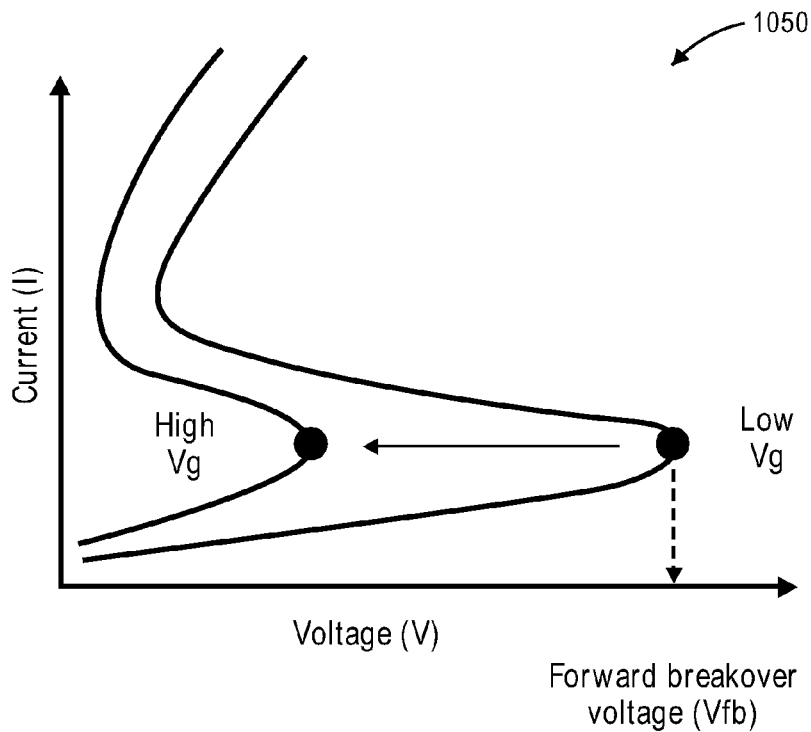
FIG. 10B illustrates current characteristics of a vertical transistor device 1000 with a thyristor-like architecture in accordance with one embodiment of the present invention.

Generally, FIG. 10B illustrates current characteristics of a vertical transistor device 1000 with a thyristor-like architecture in accordance with one embodiment of the present invention. The diagram 1050 illustrates a high forward breakover voltage (Vfb) for a low gate voltage and a lower Vfb for a high gate voltage. The junction between the source and n-base region and the junction between the n-base region and p-base region are designed to be more diffuse junctions in contrast to sharp junctions of the vertical devices described herein.

Figure 13:
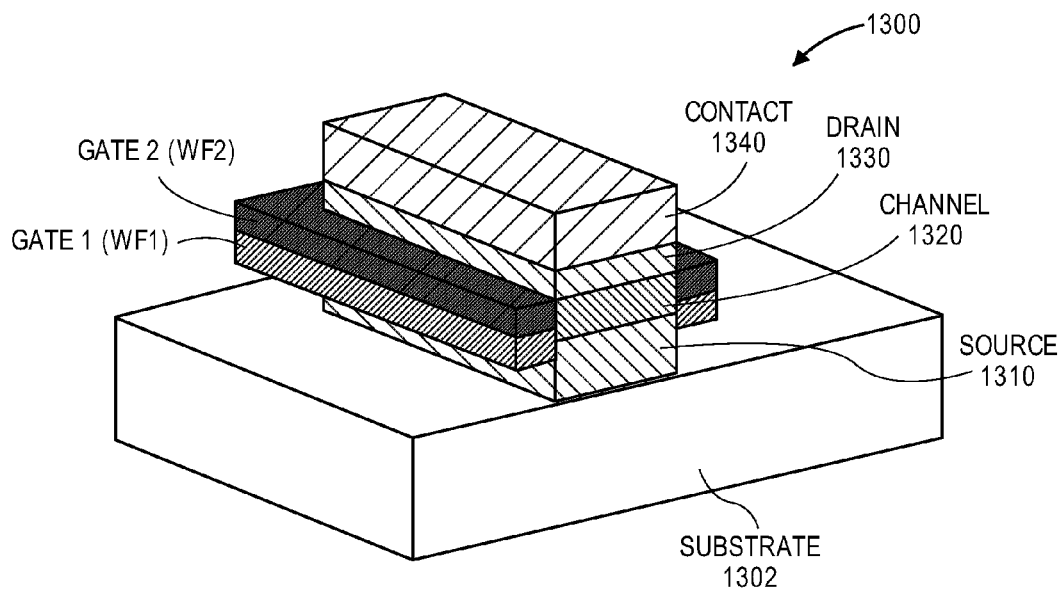
FIG. 13 illustrates a vertical transistor device 1300 in accordance with one embodiment of the present invention.

FIG. 13 illustrates a vertical transistor device 1300 in accordance with one embodiment of the present invention. The device 1300 includes a contact region 1340, a drain region 1330, a channel region 1320, a source region 1310, and a substrate 1302. A first gate layer is deposited and etched to form a first gate region (gate 1 with work function 1) that wraps around sidewalls of a portion of a source region 1310. A second gate layer is deposited and etched to form a second gate region (gate 2 with work function 2) that wraps around sidewalls of the channel region 1320. The gate layers 1 and 2 have different work functions. Thus, these gate materials introduce work function changes in the gate along the channel of the vertical device.

Figure 14:
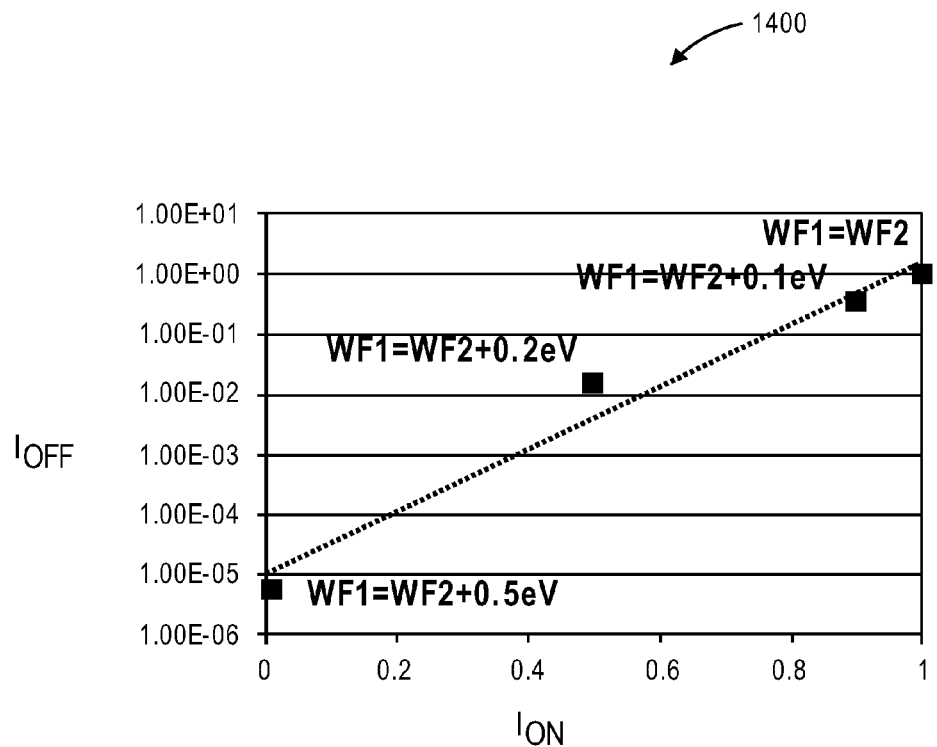
FIG. 14 illustrates a diagram showing changes in work function in a gate in accordance with one embodiment.

FIG. 14 illustrates a diagram showing changes in work function in a gate in accordance with one embodiment. The upper right corner of the diagram 1400 shows a data point for WF1=WF2. The other data points show different work function differences (e.g., 0.1 eV, 0.2 eV, 0.5 eV) for the gate closest to a drain region. Increasing WF2, which corresponds to increasing barrier height, decreases OFF current on a log scale while decreasing ON current on a linear scale. FIG. 14 illustrates large decreases in OFF current for relatively small decreases in drive current.

Figure 11:
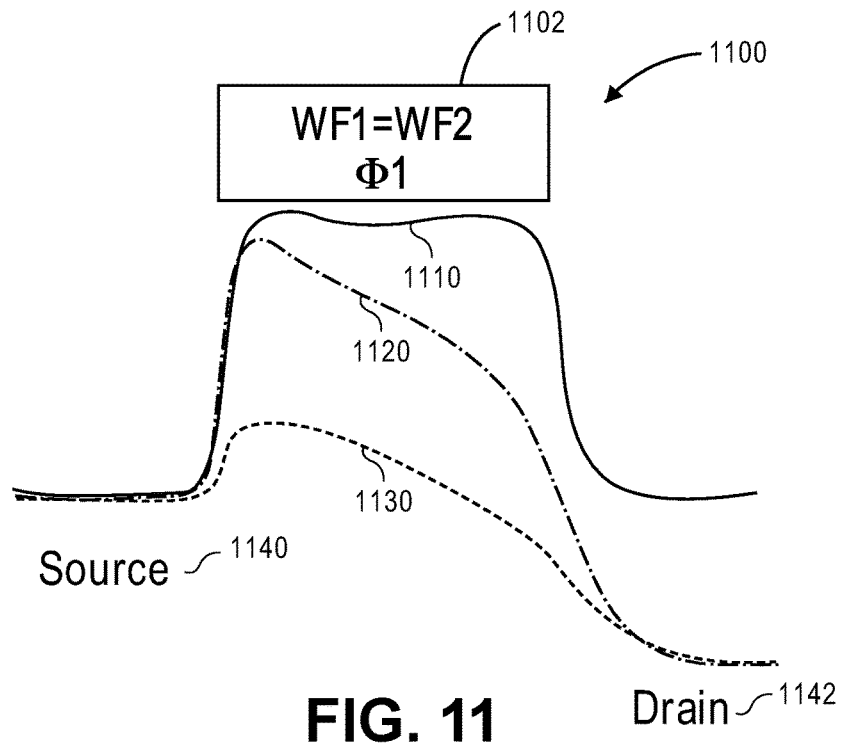
FIG. 11 illustrates an energy bandgap for when WF1 is the same as WF2.

FIG. 11 illustrates an energy bandgap for when WF1 is the same as WF2. The energy barrier height decreases from curve 1110 (Vd=Vg=0) to curve 1120 (Vd=1, Vg=0) to curve 1130 (Vd=Vg=1).

Figure 12:
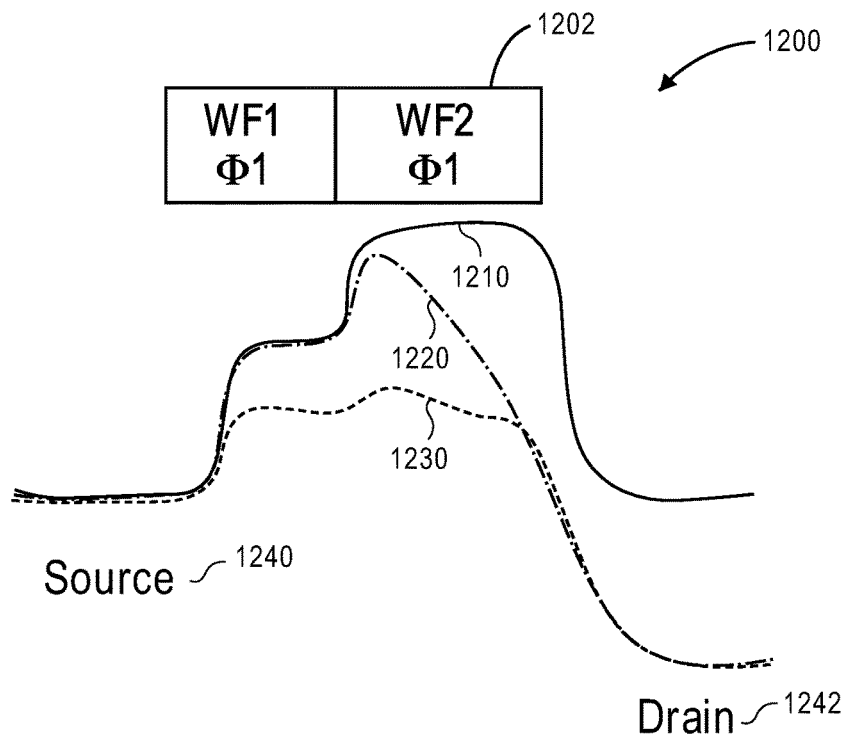
FIG. 12 illustrates an energy bandgap for when WF1 and WF2 are different in accordance with one embodiment.

FIG. 12 illustrates an energy bandgap for when WF1 and WF2 are different in accordance with one embodiment. The energy barrier height decreases from curve 1210 (Vd=Vg=0) to curve 1220 (Vd=1, Vg=0) to curve 1230 (Vd=Vg=1). The curves 1210, 1220, and 1230 have a lower energy barrier height in comparison to corresponding curves 1110, 1120, and 1130, respectively.

The vertical transistor devices of the present disclosure have been illustrated having a top contact region, a drain region, a channel region, a source region, and a gate region with rectangular dimensions though other geometric shapes are possible depending on the photolithographic operations and design requirements. The drain and source regions may be switched for any of the vertical transistor devices of the present disclosure.

In the above described embodiments, whether formed on virtual substrate layers or on bulk substrates, an underlying substrate used for vertical transistor device manufacture may be composed of a semiconductor material that can withstand a manufacturing process. In an embodiment, the substrate is a bulk substrate, such as a P-type silicon substrate as is commonly used in the semiconductor industry. In an embodiment, substrate is composed of a crystalline silicon, silicon/germanium or germanium layer doped with a charge carrier, such as but not limited to phosphorus, arsenic, boron or a combination thereof. In another embodiment, the substrate is composed of an epitaxial layer grown atop a distinct crystalline substrate, e.g. a silicon epitaxial layer grown atop a boron-doped bulk silicon mono-crystalline substrate.

The substrate may instead include an insulating layer formed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. The substrate may alternatively be composed of a group III-V material. In an embodiment, the substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, the substrate is composed of a III-V material and charge-carrier dopant impurity atoms such as, but not limited to, carbon, silicon, germanium, oxygen, sulfur, selenium or tellurium.

In the above embodiments, although not always shown, it is to be understood that the vertical transistor devices include gate stacks with a gate dielectric layer and a gate electrode layer. In an embodiment, the gate electrode of gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, aluminium oxide, lead scandium tantalum oxide, lead zinc niobate, or a combination thereof. Furthermore, a portion of gate dielectric layer may include a layer of native oxide formed from the top few layers of the corresponding channel region. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In an embodiment, the gate electrode is composed of a metal layer such as, but not limited to, metals, metal alloys, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type or N-type material. The gate electrode stack may also include dielectric spacers.

The vertical semiconductor devices described above cover both planar and non-planar devices, including gate-all-around devices. Thus, more generally, the semiconductor devices may be a semiconductor device incorporating a gate, a channel region and a pair of source/drain regions. In an embodiment, semiconductor device is one such as, but not limited to, a MOS-FET. In one embodiment, semiconductor device is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

Figure 15:
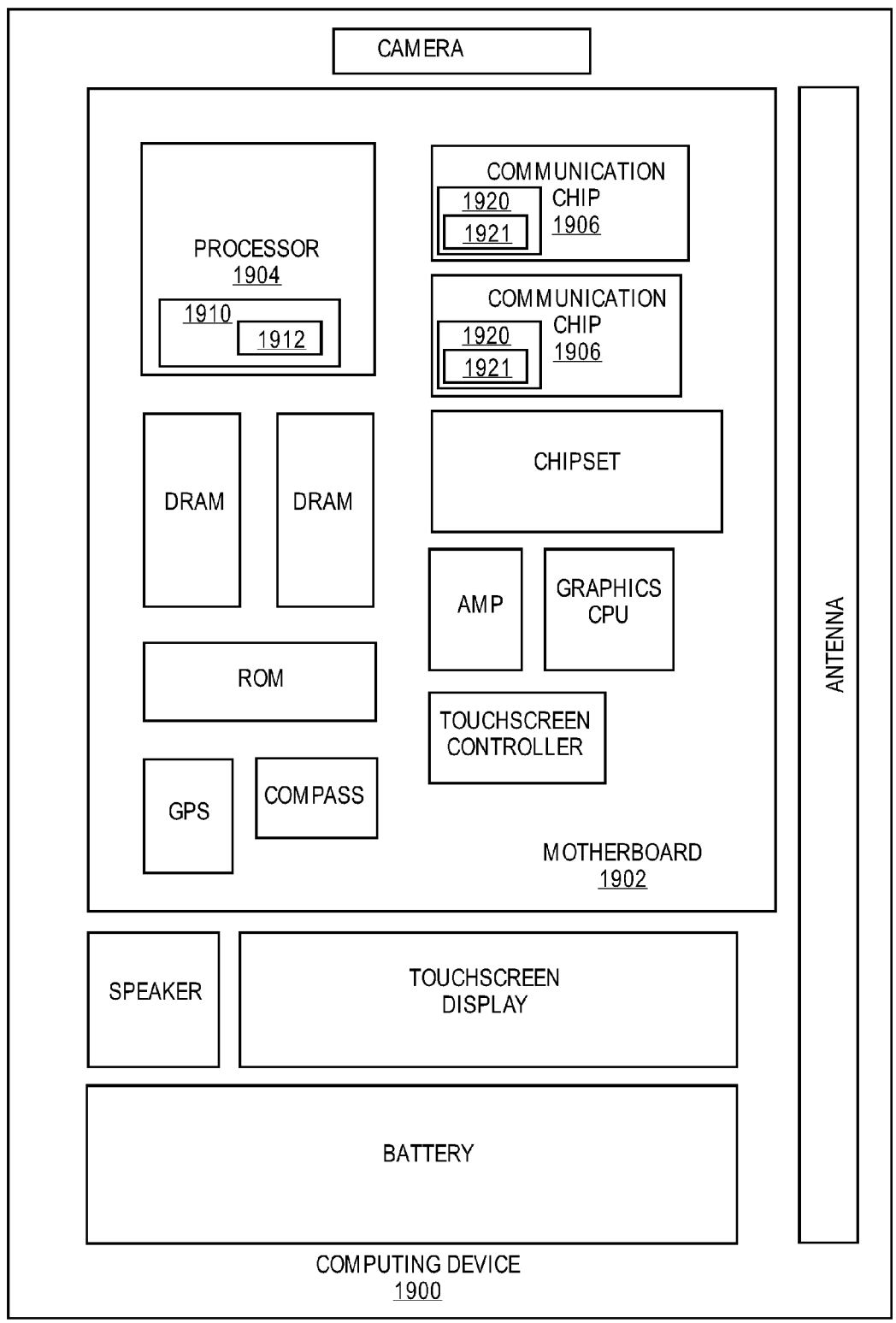
FIG. 15 illustrates a computing device in accordance with one implementation of the invention.

FIG. 15 illustrates a computing device 1900 in accordance with one implementation of the invention. The computing device 1900 houses a board 1902. The board 1902 may include a number of components, including but not limited to a processor 1904 and at least one communication chip 1906. The processor 1904 is physically and electrically coupled to the board 1902. In some implementations the at least one communication chip 1906 is also physically and electrically coupled to the board 1902. In further implementations, the communication chip 1906 is part of the processor 1904.

Depending on its applications, computing device 1900 may include other components that may or may not be physically and electrically coupled to the board 1902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1906 enables wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1900 may include a plurality of communication chips 1906. For instance, a first communication chip 1906 may be dedicated to shorter range wireless communications such as Wi-Fi and Bluetooth and a second communication chip 1906 may be dedicated to longer range wireless communications such as GPS, EDGE, GPRS, CDMA, WiMAX, LTE, Ev-DO, and others.

The processor 1904 of the computing device 1900 includes an integrated circuit die 1910 packaged within the processor 1904. In some implementations of the invention, the integrated circuit die of the processor includes one or more devices 1912, such as vertical transistor devices built in accordance with implementations of the invention. The term "processor" may refer to any device or portion of a device that processes electronic data from registers and/or memory to transform that electronic data into other electronic data that may be stored in registers and/or memory.

The communication chip 1906 also includes an integrated circuit die 1920 packaged within the communication chip 1906. In accordance with another implementation of the invention, the integrated circuit die of the communication chip includes one or more devices 1921, such as vertical transistor devices built in accordance with implementations of the invention.

In further implementations, another component housed within the computing device 1900 may contain an integrated circuit die that includes one or more devices, such as vertical transistor devices built in accordance with implementations of the invention.

In various implementations, the computing device 1900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1900 may be any other electronic device that processes data.

Thus, embodiments of the present invention include vertical transistor devices having a channel, a source region, and a drain region that can be controlled independently. Changes are introduced in a channel of a vertical transistor device in a controlled manner in such a way that a source end of the channel can differ significantly in composition from the channel and a drain end of the channel.

In an embodiment, a vertical transistor device includes an epitaxial source semiconductor region disposed on a substrate, an epitaxial channel semiconductor region disposed on the source semiconductor region, an epitaxial drain semiconductor region disposed on the channel semiconductor region, and a gate electrode region surrounding sidewalls of the semiconductor channel region. A composition of at least one of the semiconductor regions varies along a longitudinal axis that is perpendicular with respect to a surface of the substrate.

In one embodiment, the source semiconductor region can have a higher effective mass than that of the channel and drain semiconductor regions. The effective mass of the source semiconductor region may be approximately twice an effective mass of the channel and drain semiconductor regions.

In one embodiment, the channel semiconductor region has a compositional variation between a first interface with the source semiconductor region and a second interface with the drain semiconductor region.

In one embodiment, the compositional variation further includes a grading of the channel semiconductor region throughout the epitaxial film thickness.

In one embodiment, the channel semiconductor region includes a SiGe alloy with the Ge content being higher at the first interface than at the second interface. Alternatively, the channel semiconductor includes a In alloy, and the In content is higher at the first interface than at the second interface.

In one embodiment, the channel semiconductor is silicon or a SiGe alloy. The high mobility injection region can be disposed on the source semiconductor region and is composed of Ge.

In one embodiment, the compositional variation may further include a grading of the channel semiconductor region from the high mobility injection region to the second interface.

In one embodiment, the channel semiconductor region is a different semiconductor material in comparison to the source and drain semiconductor regions.

In one embodiment, a vertical transistor device includes an epitaxial source semiconductor region disposed on a substrate, an epitaxial channel semiconductor region disposed on the source semiconductor region, an epitaxial drain semiconductor region disposed on the channel semiconductor region, and a gate electrode region surrounding sidewalls of the semiconductor channel region. A composition of the gate electrode region varies along a longitudinal axis that is perpendicular with respect to a surface of the substrate.

In one embodiment, a composition of the gate electrode that is in contact with the gate dielectric varies along the longitudinal axis to differentiate a work function from a first level proximate to the source semiconductor region to a second level proximate to the drain semiconductor region. A work function of the gate electrode is greater proximate to the drain semiconductor region than proximate to the source semiconductor region.

In one embodiment, the gate electrode composition is graded from a first alloy composition proximate to the source semiconductor region to a second alloy composition proximate to the drain semiconductor region.

In one embodiment, the channel semiconductor region has a compositional variation between a first interface with the source semiconductor region and a second interface with the drain semiconductor region. A semiconductor compositional variation magnifies a difference in transistor threshold voltage associated with a differentiation in the gate electrode work function.

In one embodiment, a method of fabricating a vertical transistor device having a longitudinal axis perpendicularly oriented to a surface plane of a crystalline substrate includes depositing a source semiconductor region on the crystalline substrate, depositing a channel semiconductor region on the source semiconductor region, depositing a drain semiconductor region on the channel semiconductor region, etching through the drain, channel, and source semiconductor regions to form sidewalls through the drain, channel, and source semiconductor regions. The method further includes forming a gate dielectric region and a gate electrode on sidewalls of the channel region. The depositing further includes modifying growth conditions to vary the semiconductor composition across a thickness of the channel semiconductor region.

In one embodiment, modifying growth conditions to vary the semiconductor composition across the thickness of the channel region further comprises depositing an enhanced mobility injection region having a composition with a first carrier mobility and modifying the growth conditions to deposit a composition of semiconductor having a second carrier mobility, which is lower than that of the enhanced mobility injection region.

In one embodiment, depositing the enhanced mobility injection region further includes depositing a substantially pure Ge region.

In one embodiment, modifying growth conditions to vary the semiconductor composition across a thickness of the channel region further includes grading the composition of the channel semiconductor from a first interface with source region to a second interface with the drain region. In one embodiment, the source, channel, and drain semiconductor regions are group IV or group III-V regions.

In one embodiment, a computing device includes memory to store electronic data and a processor coupled to the memory. The processor processes electronic data. The processor includes an integrated circuit die having vertical transistor devices. At least one vertical transistor device includes a first epitaxial semiconductor region (e.g., source region, drain region) disposed on a substrate, a second epitaxial semiconductor region (e.g., channel region) disposed on the source semiconductor region, a third epitaxial semiconductor region (e.g., drain region, source region) disposed on the channel semiconductor region, and a gate electrode region surrounding sidewalls of the semiconductor channel region. A composition of at least one of the semiconductor regions varies along a longitudinal axis that is perpendicular with respect to a surface of the substrate. In one embodiment, the source semiconductor region has a higher effective mass than that of the channel and drain semiconductor regions. In one embodiment, the channel semiconductor region has a compositional variation between a first interface with the source semiconductor region and a second interface with the drain semiconductor region.

In one embodiment, the compositional variation further includes a grading of the channel semiconductor region throughout the epitaxial film thickness. In one embodiment, the first semiconductor region is a source region, the second semiconductor region is a channel region, and the third semiconductor region is a drain region, wherein the channel semiconductor region has a compositional variation between a first interface with the source semiconductor region and a second interface with the drain semiconductor region. The compositional variation further comprises a grading of the channel semiconductor region throughout the epitaxial film thickness. In another embodiment, the first semiconductor region is a drain region, the second semiconductor region is a channel region, and the third semiconductor region is a source region.

What is claimed is:

1. A method of fabricating a vertical transistor device, comprising:
    depositing an epitaxial source semiconductor layer on a substrate;
    depositing an epitaxial channel semiconductor layer on the source semiconductor layer;
    depositing an epitaxial drain semiconductor layer on the channel semiconductor layer;
    etching through the drain, channel, and source semiconductor layers to form a drain semiconductor region, a channel semiconductor region, and a source semiconductor region, each having a plurality of sidewalls; and
    forming a gate electrode region to surround the plurality of sidewalls of the channel semiconductor region, wherein a composition of at least one of the semiconductor regions varies along a longitudinal axis of the vertical transistor device that is perpendicular with respect to a surface of the substrate, wherein the source semiconductor region has a higher effective mass than that of the channel and drain semiconductor regions.

2. The method of claim 1, wherein the effective mass of the source semiconductor region is approximately twice an effective mass of the channel and drain semiconductor regions.

3. The method of claim 1, wherein the channel semiconductor region has a compositional variation between a first interface with the source semiconductor region and a second interface with the drain semiconductor region.

4. The method of claim 3, wherein the compositional variation further comprises a grading of the channel semiconductor region throughout an epitaxial film thickness of the channel semiconductor region.

5. The method of claim 3, wherein the channel semiconductor region comprises a SiGe alloy, and wherein the Ge content is higher at the first interface than at the second interface, or wherein the channel semiconductor comprises a In alloy, and wherein the In content is higher at the first interface than at the second interface.

6. The method of claim 1, wherein the channel semiconductor is silicon or a SiGe alloy, and wherein a high mobility injection region is disposed on the source semiconductor region and is composed of Ge.

7. The method of claim 6, wherein the compositional variation further comprises a grading of the channel semiconductor region from the high mobility injection region to the second interface.

8. The method of claim 1, wherein the channel semiconductor region is a different semiconductor material in comparison to the source and drain semiconductor regions.

9. A method of fabricating a vertical transistor device, comprising:
    depositing an epitaxial source semiconductor region on a substrate;
    depositing an epitaxial channel semiconductor region on the source semiconductor region;
    depositing an epitaxial drain semiconductor region on the channel semiconductor region;
    forming a plurality of sidewalls through each of the drain, channel, and source semiconductor regions; and
    forming a gate electrode region to surround a plurality of sidewalls of the channel semiconductor region, wherein a composition of the gate electrode region varies along a longitudinal axis of the vertical transistor device that is perpendicular with respect to a surface of the substrate.

10. The method of claim 9, wherein a composition of the gate electrode region in contact with a gate dielectric region varies along the longitudinal axis to differentiate a work function from a first level proximate to the source semiconductor region to a second level proximate to the drain semiconductor region.

11. The method of claim 10, wherein the gate electrode composition is graded from a first alloy composition proximate to the source semiconductor region to a second alloy composition proximate to the drain semiconductor region.

12. The method of claim 10, wherein the channel semiconductor region has a compositional variation between a first interface with the source semiconductor region and a second interface with the drain semiconductor region, wherein a semiconductor compositional variation to magnify a difference in transistor threshold voltage associated with a differentiation in the gate electrode work function.

13. The method of claim 9, wherein a work function of the gate electrode region is greater proximate to the drain semiconductor region than proximate to the source semiconductor region.

14. A method of fabricating a vertical transistor device having a longitudinal axis perpendicularly oriented to a surface plane of a crystalline substrate, the method comprising:
    depositing a source semiconductor region on the crystalline substrate;
    depositing a channel semiconductor region on the source semiconductor region;
    depositing a drain semiconductor region on the channel semiconductor region;
    etching through the drain, channel, and source semiconductor regions to form a plurality of sidewalls through the drain, channel, and source semiconductor regions; and
    forming a gate dielectric region and a gate electrode region to surround a plurality of channel semiconductor region sidewalls of the vertical transistor device, wherein the depositing further comprises modifying growth conditions to vary the semiconductor composition across a thickness of the channel semiconductor region.

15. The method of claim 14, wherein modifying growth conditions to vary the semiconductor composition across the thickness of the channel semiconductor region further comprises depositing an enhanced mobility injection region having a composition with a first carrier mobility, and modifying the growth conditions to deposit a composition of semiconductor having a second carrier mobility, lower than that of the enhanced mobility injection region.

16. The method of claim 15, wherein depositing the enhanced mobility injection region further comprises depositing substantially pure Ge region.

17. The method of claim 15, wherein modifying growth conditions to vary the semiconductor composition across a thickness of the channel semiconductor region further comprises grading the composition of the channel semiconductor from a first interface with source semiconductor region to a second interface with the drain semiconductor region.

18. The method of claim 14, wherein the source, channel, and drain semiconductor regions are group IV or group III-V regions.

* * * * *